US006927129B1

(12) United States Patent
Sun et al.

(10) Patent No.: US 6,927,129 B1
(45) Date of Patent: Aug. 9, 2005

(54) NARROW WIDE SPACER

(75) Inventors: Yu Sun, Saratoga, CA (US); Kuo-Tung Chang, Saratoga, CA (US); Angela T. Hui, Fremont, CA (US); Shenqing Fang, Fremont, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 10/821,312

(22) Filed: Apr. 8, 2004

(51) Int. Cl.[7] .......................................... H01L 21/8247
(52) U.S. Cl. ...................................... 438/258; 438/275
(58) Field of Search ................................ 438/257–267, 438/275, 286

(56) References Cited

U.S. PATENT DOCUMENTS

| | | | | |
|---|---|---|---|---|
| 5,933,730 A | * | 8/1999 | Sun et al. ................ 438/258 |
| 6,352,891 B1 | * | 3/2002 | Kasai ....................... 438/241 |
| 6,506,642 B1 | * | 1/2003 | Luning et al. ............ 438/231 |

* cited by examiner

Primary Examiner—Richard A. Booth

(57) ABSTRACT

A method for fabricating a semiconductor device. Specifically, A method of manufacturing a semiconductor device comprising: depositing a first oxide layer over a periphery transistor comprising a gate stack, a drain side sidewall and a source side sidewall and over a core transistor comprising a gate stack, a source side sidewall and a drain side sidewall; etching the first oxide layer wherein a portion of the first oxide layer remains on the source side sidewall and on the drain side sidewall of the periphery transistor and on the source side sidewall and on the drain side sidewall of the core transistor; etching the first oxide layer from the source side sidewall of the core transistor; depositing a second oxide layer over the periphery transistor and the core transistor; and etching the second oxide layer wherein a portion of the second oxide layer remains on the first oxide layer formed on the source side sidewall and on the drain side sidewall of the periphery transistor and wherein the second oxide layer remains on the source side sidewall and on the drain side sidewall of the core transistor.

23 Claims, 16 Drawing Sheets

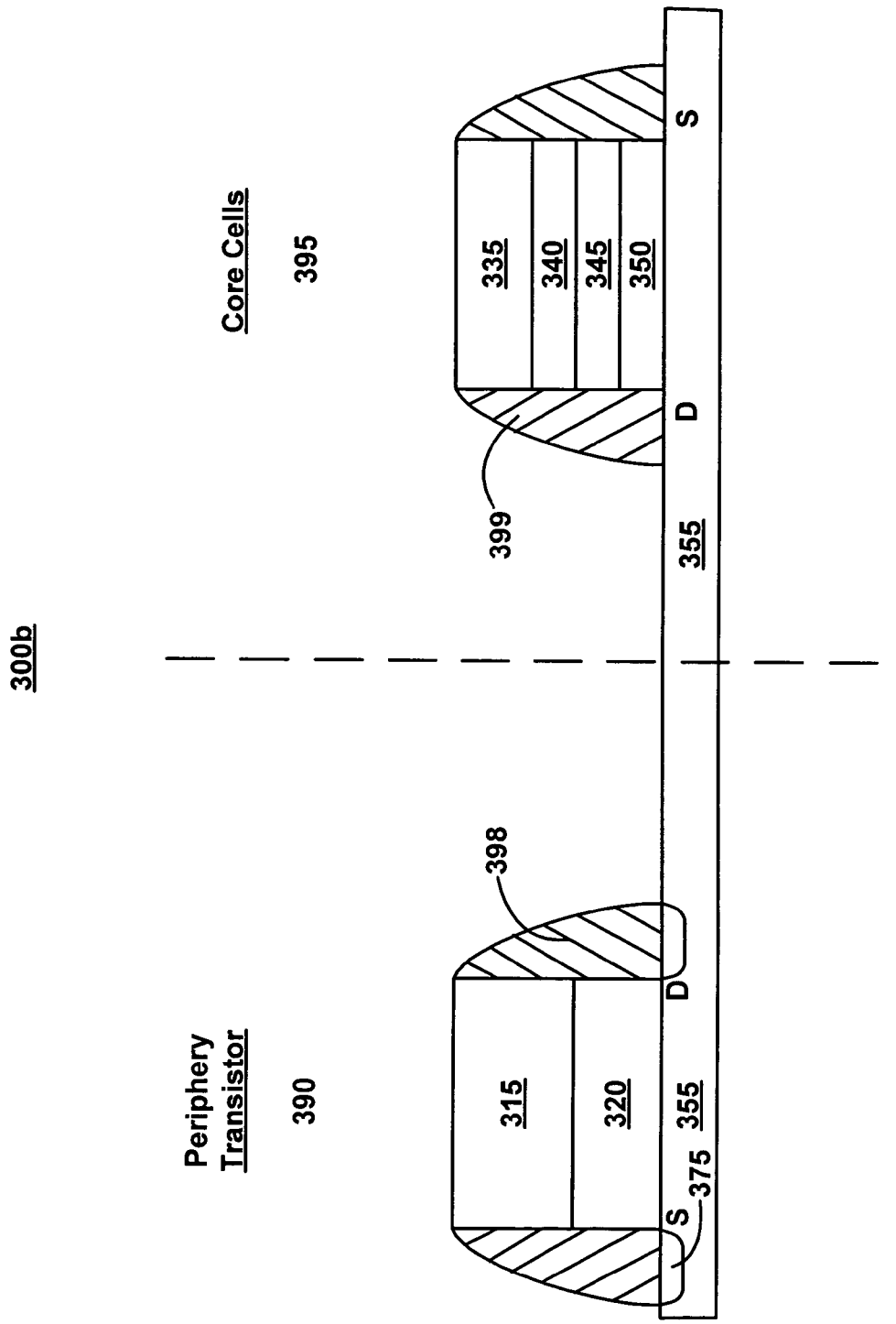

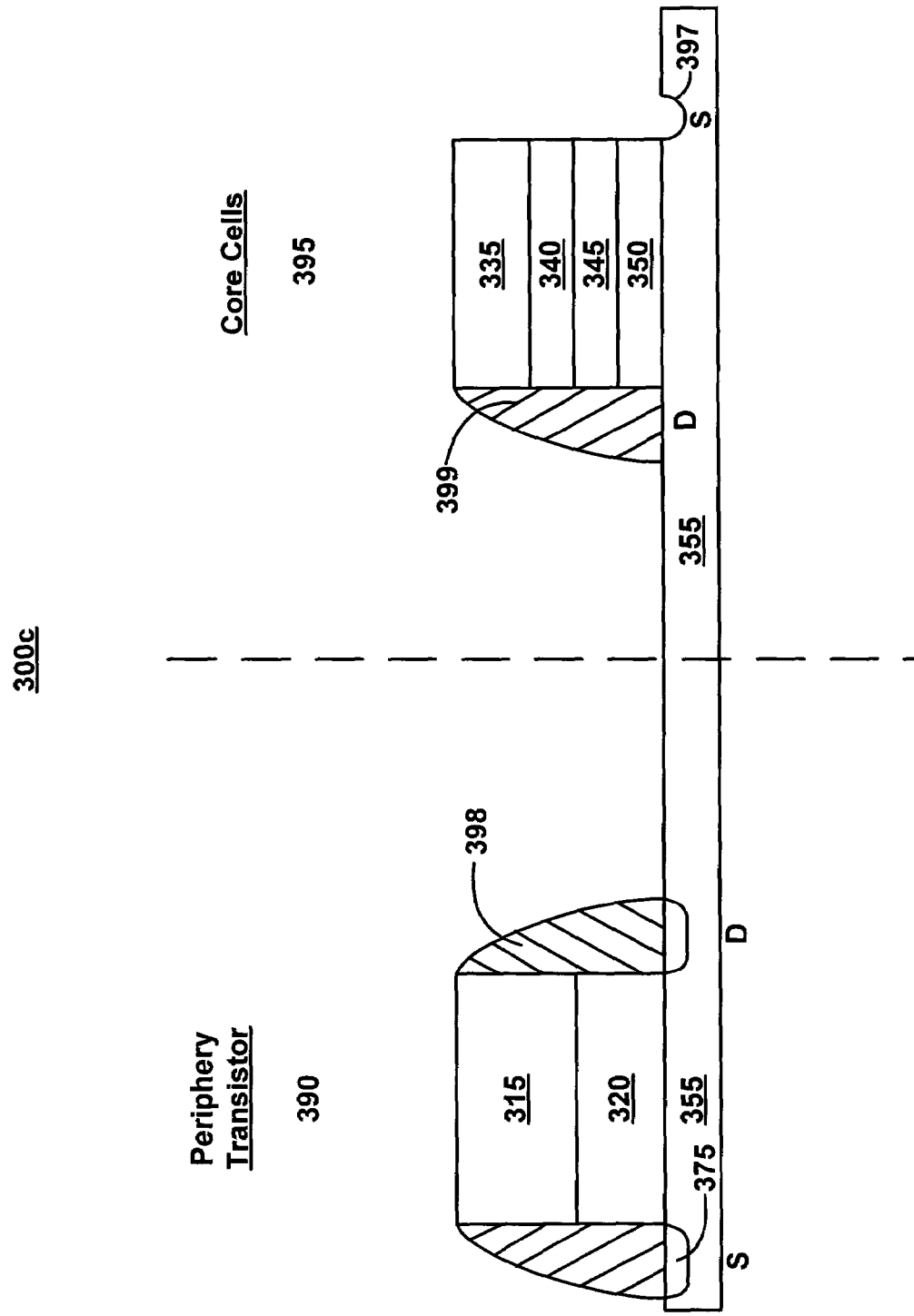

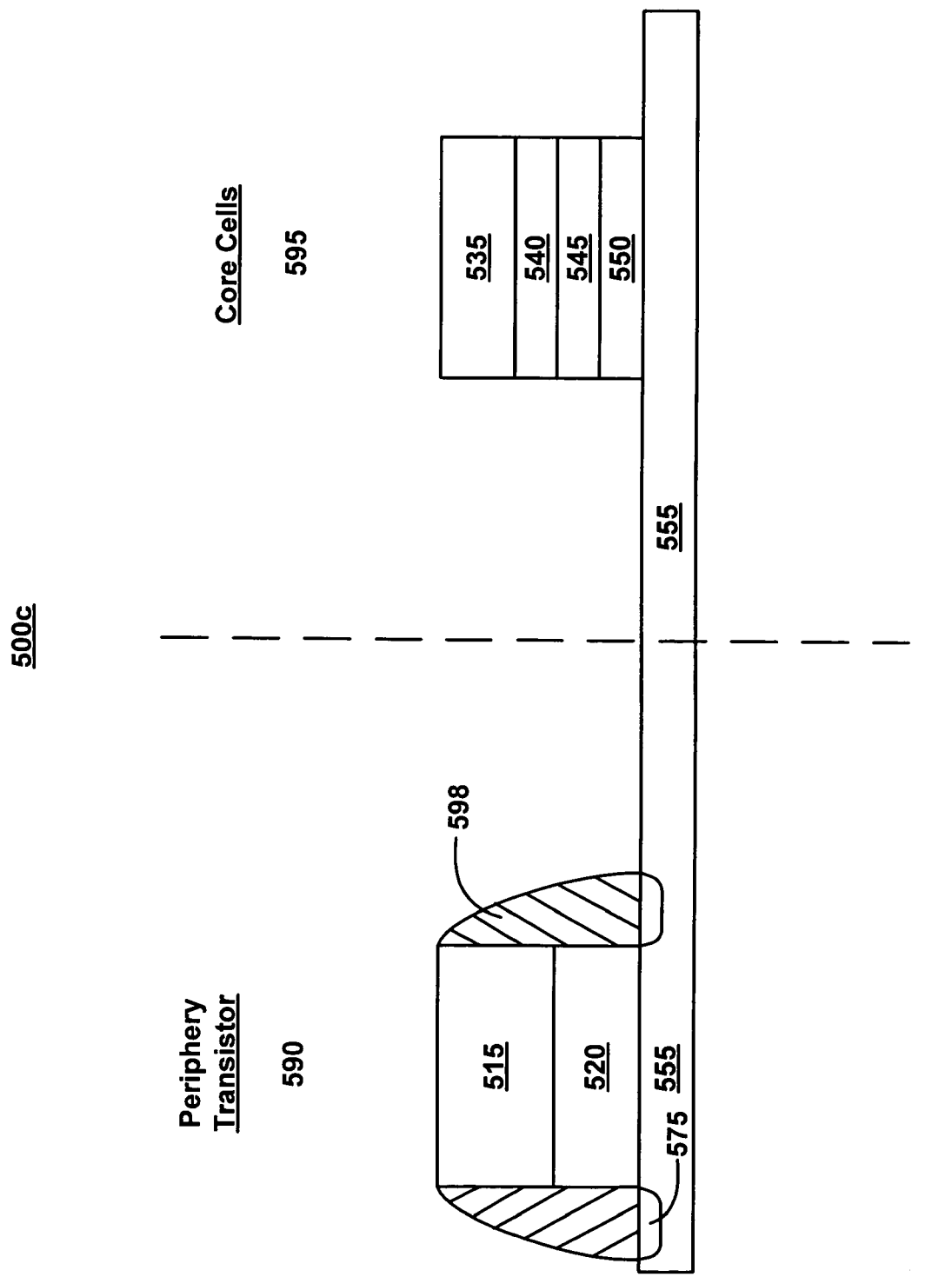

US 6,927,129 B1

NARROW WIDE SPACER

TECHNICAL FIELD

The present invention relates to the field of semiconductor memory device fabrication. Specifically, embodiments of the present invention relate to simultaneously forming wide sidewall spacers for peripheral transistors and narrow sidewall spacers for core transistors to reduce short channel effects.

BACKGROUND ART

Flash memory, which is sometimes called "flash ROM", is a type of non-volatile memory that can be erased and reprogrammed in units of memory called blocks. It is a variation of electrically erasable programmable read-only memory which, unlike flash memory, is erased and rewritten at the byte level, which is slower than flash memory updating. Flash memory is used in digital cellular phones, digital cameras, LAN switches, PC Cards for notebook computers, digital set-up boxes, embedded controllers, and other devices.

Flash memory gets its name from the organization of the microchip, which allows a section of the memory cells to be erased in a single action or "flash". Flash memory uses higher voltages than most other types of memory cells. A conventional semiconductor memory device containing flash memory cells at the core of the device also contains periphery transistors that can handle and supply the higher voltage needed for the core flash memory cells. The periphery transistors have a lightly doped drain (LDD) region implanted in the substrate and then a sidewall is formed and a higher doped source/drain region is formed behind the LDD in order to handle the higher voltages needed. As the dosage in the higher dose source/drain region becomes higher, a wider spacer is needed. A wider spacer impacts the size requirements for the ever-decreasing semiconductor device configuration.

Prior Art FIG. 1A illustrates the basic configuration of a conventional periphery transistor 100a with a design channel length 170 and effective channel length 175. Substrate 105 contains a grown layer of gate oxide 130 and a layer comprising a polysilicon floating gate 110. After an LDD region 140 is implanted into substrate 105, a sidewall spacer 120 is deposited and a higher doped source/drain region 150 is implanted. When voltage is applied, current 160 flows from source to drain.

Prior Art FIG. 1B Illustrates a conventional periphery transistor 100b with a design channel length 170 and an effective channel length 185 in which the higher doped source/drain region 150 is diffused past the LDD 140 region and under the gate 110 area. When high voltage is applied in this instance, current 160 may flow through substrate 105 rather than flowing from source to drain. The memory cell 100b thus may become inoperable. This malfunction is referred to as a current breakdown.

Another problem that may occur when the source/drain region 150 diffuses under the gate 110 area is known as short channel effect. Design channel length 170 is measured from one edge of polysilicon gate 110 to the other, but effective channel length 175 of Prior Art FIGS. 1A and 185 of Prior Art FIG. 1B is approximately the distance from one inner edge of the LDD 140 and/or source/drain region 150 to the other inner edge, whichever is shortest. Threshold voltage is a function of effective channel length as shown in Prior Art FIG. 2A. If effective channel length varies substantially from design channel length, the threshold voltage may be out of specification, causing a malfunction of the transistor. For example, if the design threshold voltage is between lower limit 210 and upper limit 220 of FIG. 2A, it is possible that transistor 100a of FIG. 1A would perform optimally at point 215 on curve 200a. However, if source/drain 150 were diffused under LDD 140 as shown in FIG. 1B, the threshold voltage may drop to point 205 on curve 200a of FIG. 2A. This could put the threshold out of spec and cause a malfunction of transistor 100b.

Flash memory cells (core cells) are generally comprised of a transistor connected to a word line and a bit line. The transistor includes a gate stack comprised of a polysilicon cap, a control gate, a control gate dielectric, a floating gate, and a tunnel oxide. The polysilicon cap is disposed over the control gate, which is disposed over the control gate dielectric. The control gate dielectric is disposed over the floating gate, which is disposed over the tunnel oxide. The gate stack is located between a source and a drain. An insulative spacer abuts each side of the gate stack. The drain is connected to the bit line through a contact. The word line is connected to the control gate of the transistor. The flash memory cell stores data (e.g., a 1 or 0) in the floating gate. Unlike periphery transistors, a thick sidewall is not required to reduce short channel effects because a core (flash) memory cell does not operate at relatively high voltages as do periphery transistors.

As the state-of-the-art semiconductor devices become increasingly smaller, the conventional process for forming the sidewall spacers for core cells (flash memory cells) at the drain region may become inadequate because of the desired close proximity to the next core cell to increase cell density. A core memory cell does not require a wide spacer as does a periphery transistor and a thick spacer deleteriously decreases cell density. Currently, semiconductor manufacture creates a wide spacer for periphery transistors, but to manufacture narrow spacers for core memory cells, numerous processing must be performed.

Since the requirements for periphery transistors and core cells are different, the sidewall spacers for periphery transistors and core cells are formed in separate processing steps to achieve the desired thickness for each spacer. Currently, manufacturing processes require separate processing steps to form a wide sidewall spacer for a periphery transistor and a separate processing steps to form a narrow sidewall spacer for core transistors.

Thus, what is needed is a method for fabricating a semiconductor device that allows simultaneously formation of wide side-wall spacers for periphery transistors to facilitate operating at high voltage, and narrow drain side sidewall spacers for core cells to improve density, thereby reducing malfunctions and improving performance in periphery transistors and core flash memory cells of the conventional semiconductor devices.

DISCLOSURE OF INVENTION

The present invention provides a method for fabricating a semiconductor device that allows simultaneous manufacture of wide sidewall spacers for periphery transistors and narrow sidewall spacers for core flash memory cells, thereby reducing malfunctions and improving performance in periphery transistors and core flash memory cells of the conventional semiconductor devices.

In various embodiments, the present invention presents a method for fabricating a semiconductor device. Specifically, one embodiment of the present invention includes a method of manufacturing a semiconductor device comprising depositing a first oxide layer over a periphery transistor comprising a gate stack, a drain side sidewall and a source side sidewall and over a core transistor comprising a gate stack, a source side sidewall and a drain side sidewall. Once deposited, the method further includes etching the first oxide layer wherein a portion of the first oxide layer remains on the source side sidewall and on the drain side sidewall of the periphery transistor and on the source side sidewall and on the drain side sidewall of the core transistor. Then the process further includes etching the first oxide layer from the source side sidewall of the core transistor. To further form the sidewall spacers, the method further includes depositing a second oxide layer over the periphery transistor and the core transistor; and etching the second oxide layer wherein a portion of the second oxide layer remains on the first oxide layer formed on the source side sidewall and on the drain side sidewall of the periphery transistor and wherein the second oxide layer remains on the source side sidewall and on the drain side sidewall of the core transistor.

Another embodiment of the present invention provides a method for manufacturing a semiconductor having wide sidewall spacers for periphery transistors and narrow sidewall spacers for core flash memory cells. Specifically, one embodiment of the present invention is implemented as a method for simultaneously manufacturing a wide sidewall spacer on a periphery transistor and a narrow sidewall spacer on a core transistor comprising. The method includes depositing a first oxide layer over a periphery transistor comprising a gate stack, a drain side sidewall and a source side sidewall and over a core transistor comprising a gate stack, a source side sidewall and a drain side sidewall. Once the oxide layer is deposited, the first oxide layer is etched wherein a portion of the first oxide layer remains on the source side sidewall and on the drain side sidewall of the periphery transistor and on the source side sidewall and the drain side sidewall of the core transistor. Furthermore, the method includes masking and etching the oxide layer from the source side sidewall and the drain sidewall of the core transistor; depositing a second oxide layer over the periphery transistor and the core transistor; and etching the second oxide layer wherein a portion of the second oxide layer remains on the first oxide layer formed on the source side sidewall and the drain side sidewall of the periphery transistor. The process results in a wide sidewall spacer and wherein the second oxide layer remains on the source side sidewall and the drain side sidewall of the core transistor resulting in a narrow sidewall spacer.

Other features and advantages of the invention will become apparent to those of ordinary skill in the art after having read the following detailed description of the preferred embodiments taken in conjunction with the accompanying drawings, illustrating by way of example the principles of the invention.

BRIEF DESCRIPTION OF DRAWINGS

The accompanying drawings, which are incorporated in and form a part of this specification, illustrate embodiments of the invention and, together with the description, serve to explain the principles of the present invention:

Prior Art

Prior Art

Prior Art

FIG. 3B illustrates a step in the fabrication of a semiconductor device in accordance with one embodiment of the present invention, showing the formation of side wall spacers after a blanket etch.

FIG. 3C illustrates a semiconductor device in accordance with one embodiment of the present invention, showing the formed sidewall spacers after a self-aligned source etch.

FIG. 5C illustrates a semiconductor device in accordance with one embodiment of the present invention, showing the formed sidewall spacers after masking and removing a sidewall spacer in a core memory cell.

The drawings referred to in this description should not be understood as being drawn to scale except if specifically noted.

MODE(S) FOR CARRYING OUT THE INVENTION

Reference will now be made in detail to the preferred embodiments of the present invention, a narrow wide spacer.

While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, an embodiment of the present invention is disclosed as a method for fabricating a semiconductor device that allows for simultaneously forming a narrow sidewall spacer for a core memory cell and a wide sidewall spacer for a periphery transistor on the same substrate.

For clarity, process 400 of FIG. 4 will be described in conjunction with FIGS. 3A–3E that illustrate structure 300 as it undergoes process 400 of FIG. 4.

Figure 1A:
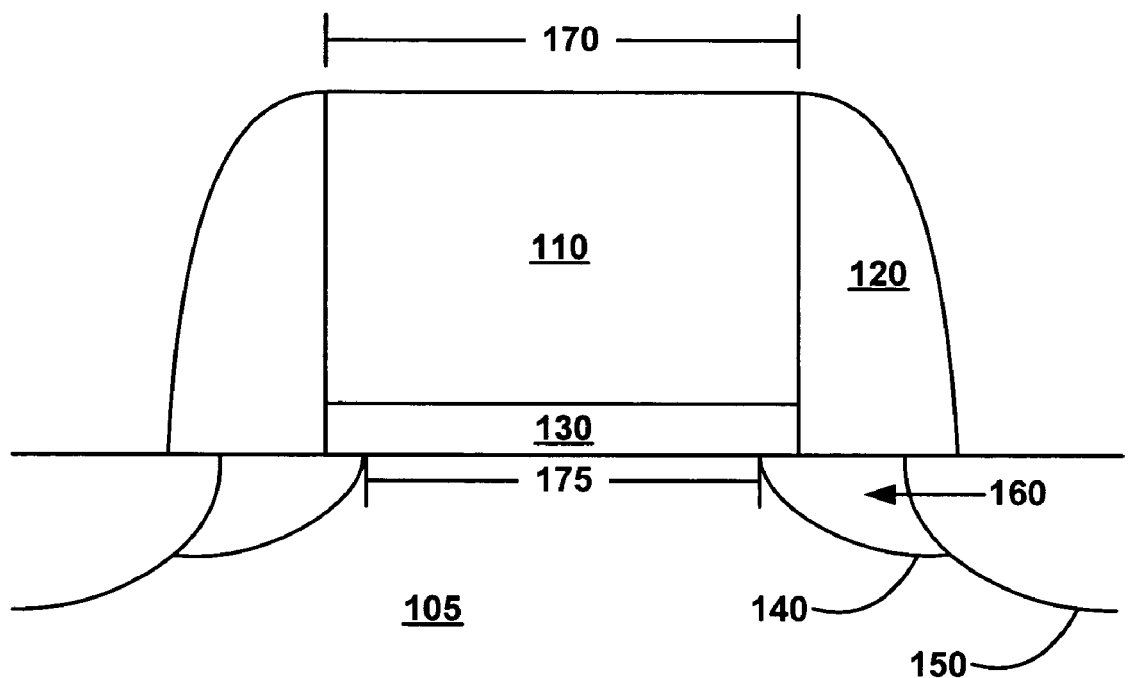
FIG. 1A illustrates a conventional periphery transistor.
Figure 1B:
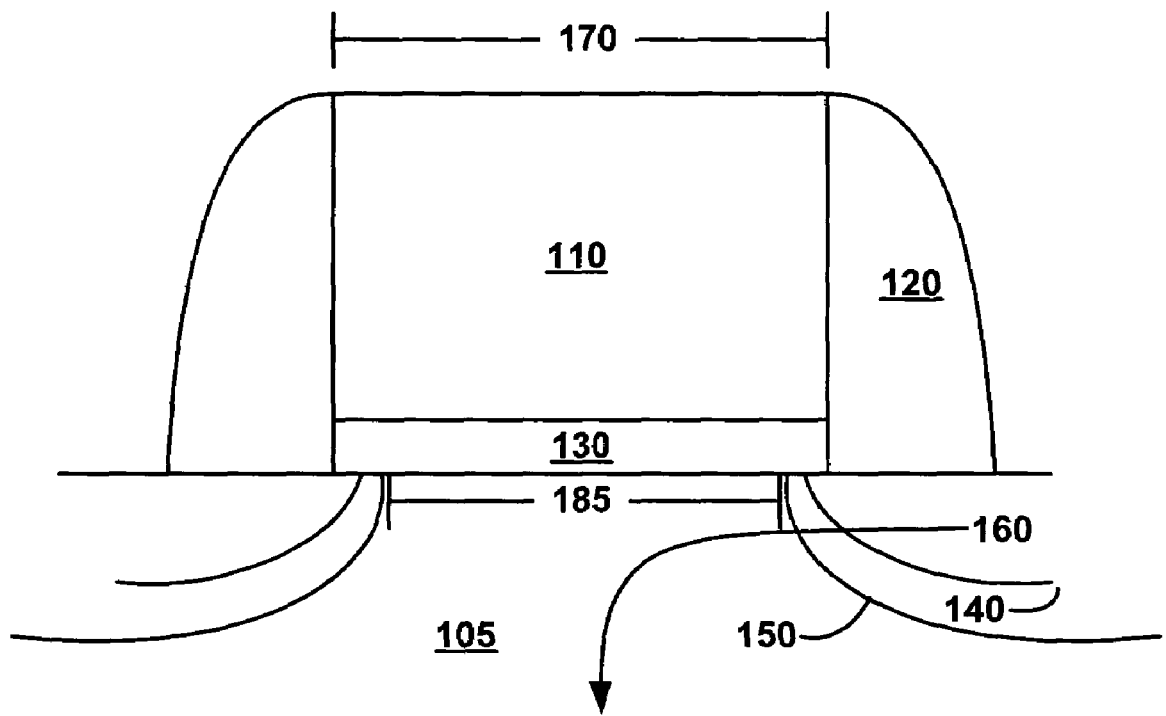
FIG. 1B illustrates a periphery transistor with source and drain regions diffused under the lightly doped drain region.
Figure 2:
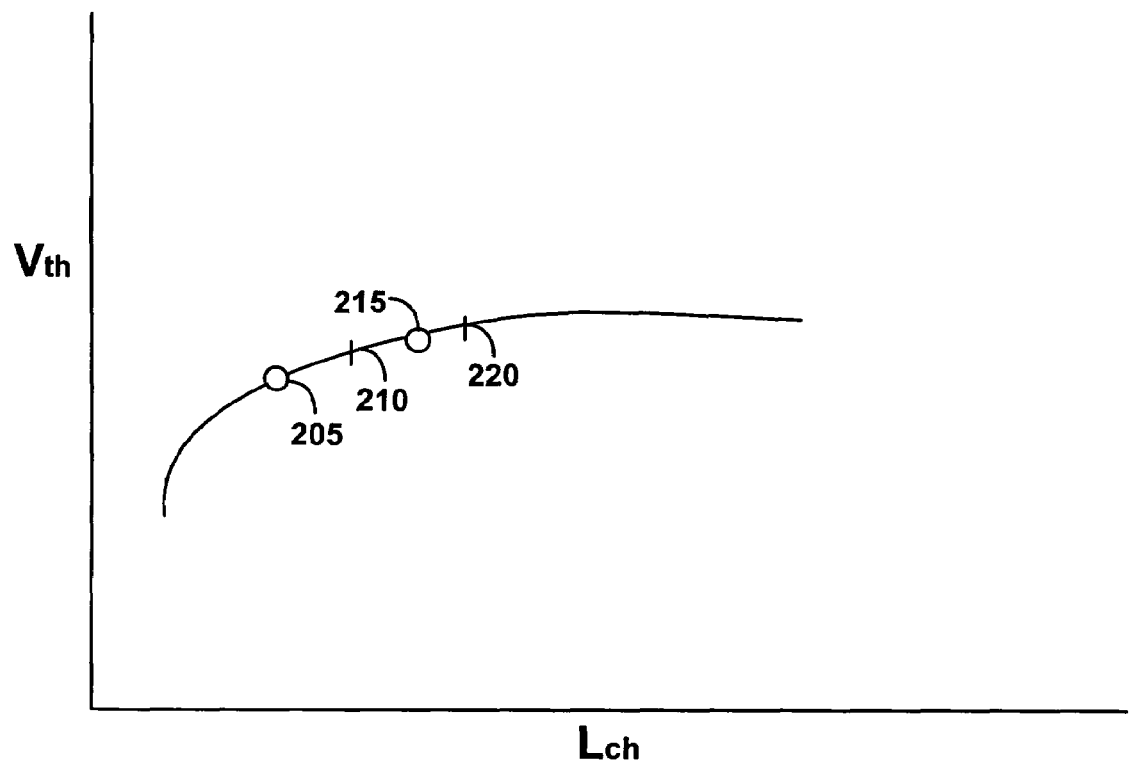
FIG. 2 illustrates the relationship between channel length and threshold voltage.
Figure 3A:
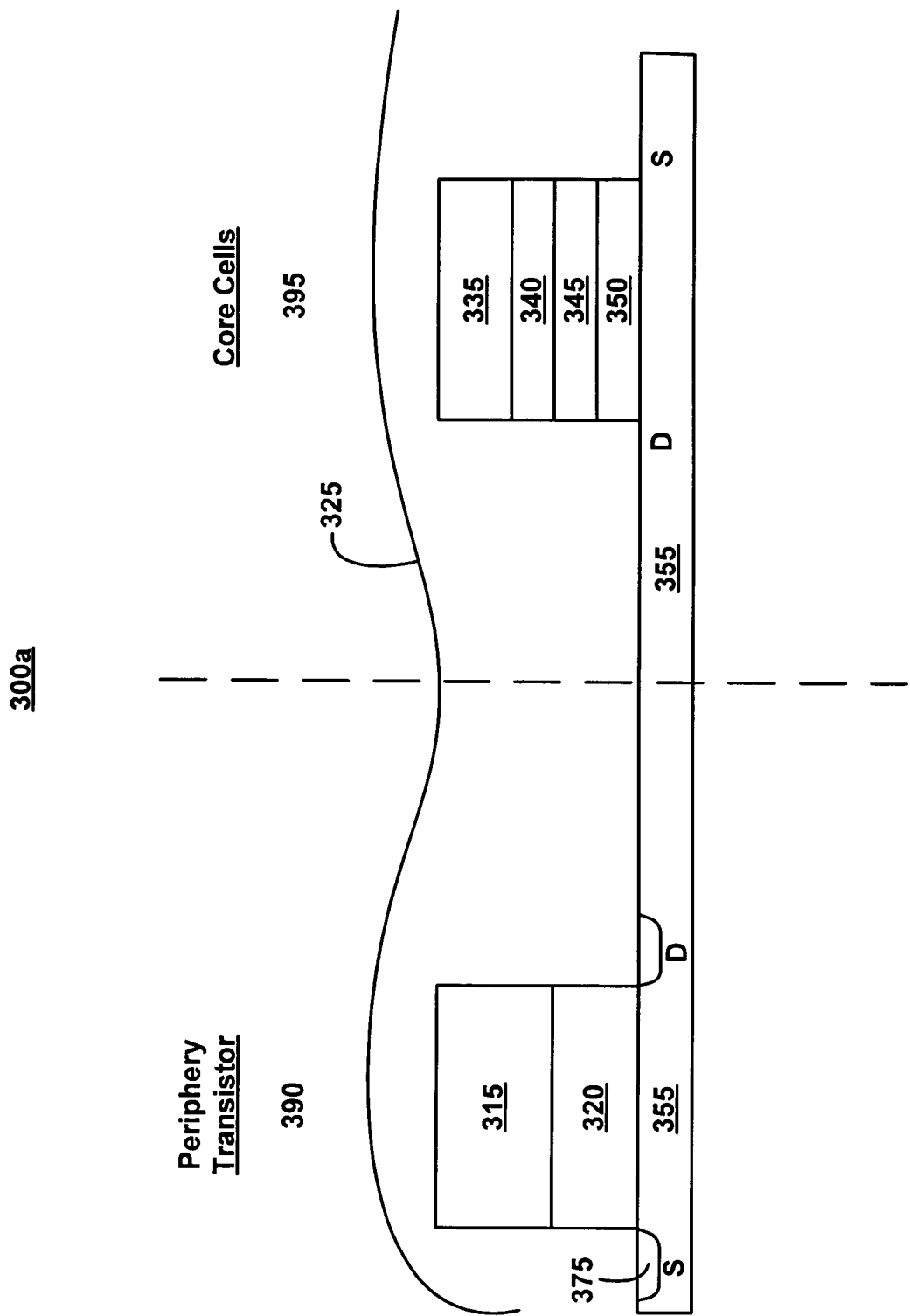
FIG. 3A illustrates a step in the fabrication of a semiconductor device in accordance with one embodiment of the present invention, showing the formation of an oxide layer over a periphery transistor gate stack and over a core cell transistor gate stack.
Figure 4:
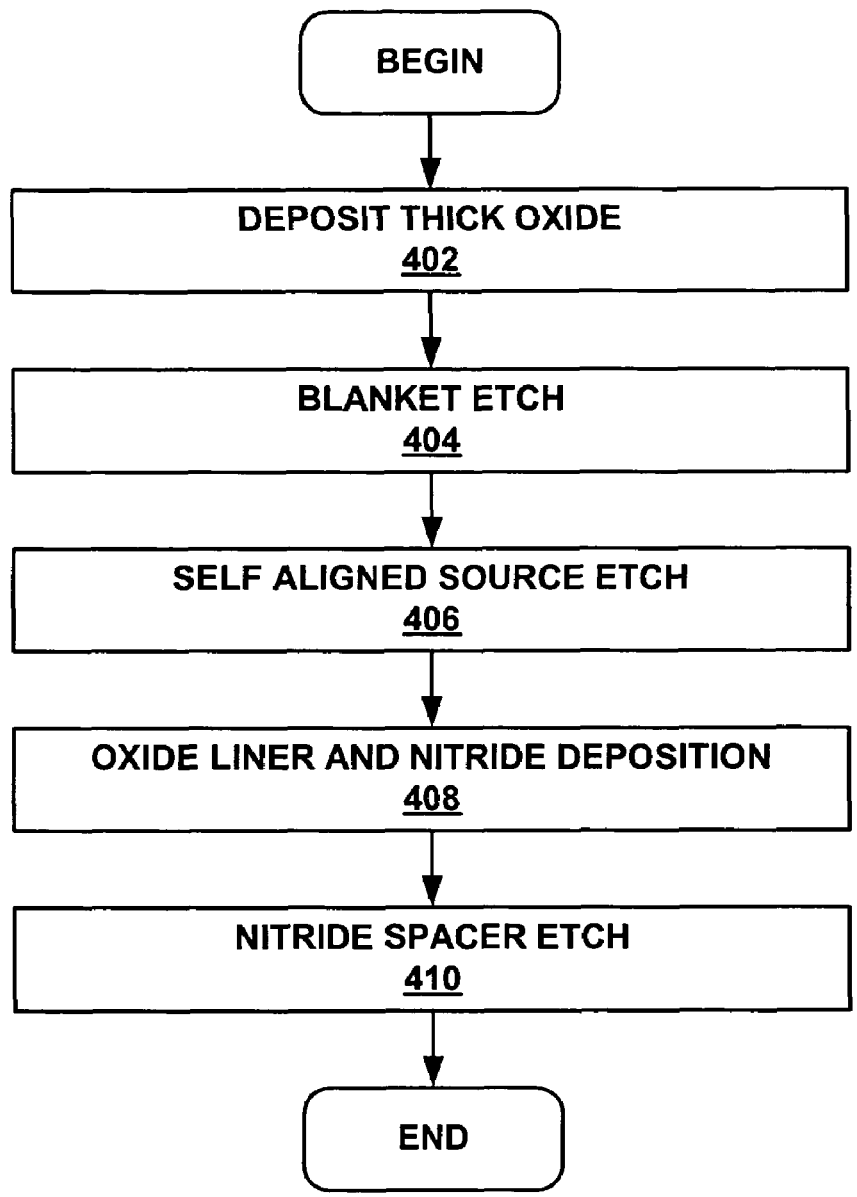
FIG. 4 is a flow diagram, in accordance with one embodiment of the present invention, of a method for fabricating semiconductor device having a narrow sidewall spacer on a core memory cell and a wide sidewall spacer on a periphery transistor.

FIG. 3A illustrates a state 300a in the fabrication of semiconductor device 300a in accordance with an embodiment of the present invention. Specifically, FIG. 3A shows the deposition of thick coating layer 325 over periphery transistor 390 and core memory cell 395. The deposition of thick oxide is step 402 of process 400 described in FIG. 4. The thick coating layer 325 can be silicon oxide alone or can be combined with silicon nitride (SiN). The present embodiment forms an oxide layer over periphery transistor 390 after lightly forming doped drain (LDD) region 375. In the present embodiment, periphery transistor 390 comprises a tunnel oxide layer 320 formed on a semiconductor substrate 355, and a polysilicon gate 315.

At the same time, core memory cells 395 receive the same coating layer 325 of silicon oxide. In one embodiment of the present invention, coating layer 325 is a combination of silicon oxide and silicon nitride. According to one embodiment, core memory cells 395 are flash memory cells. Flash memory cells are composed of a tunnel oxide layer 350 formed on substrate 355, a floating gate 345 formed on the tunnel oxide layer 350. A multi-level (e.g., ONO) insulating layer 340 is formed on the floating gate 345 and a control gate 335 formed on insulating layer 340.

FIG. 3B illustrates a further state 300b in the fabrication of semiconductor device 300b, in accordance with one embodiment of the present invention, showing the formation of side wall spacers 398 in a periphery transistor 390 and side wall spacers 399 in a core memory cell 395 after a blanket etch. A blanket etch is performed in step 404 of process 400 described in FIG. 4. According to one embodiment, the thick oxide layer (325 from FIG. 3A) fills between the periphery transistor and core memory cells 395 and after a blanket etch forms sidewall spacer 398 and 399. The excess silicon nitride layer between is removed during a blanket etch. In one embodiment of the invention, the blanket etch can be a chemical etch. The blanket etch enables the formation of sidewall region 398 at the periphery transistor and sidewall region 399 at the core memory cells. In one embodiment of the present invention, the sidewall spacers 398 and 399 are larger at the bottom end closest to substrate 355 and taper towards the top of the gate stack. In one embodiment of the present invention, the sidewall spacer 398 is substantially the same width at the bottom (closest to substrate 355) as the LDD 375.

FIG. 3C illustrates a semiconductor device in accordance with one embodiment of the present invention, showing the removal of a sidewall spacer on the source side of core cell 395 after a self-aligned source (SAS) etch. A SAS etch is performed in step 406 of process 400 described in FIG. 4. A self-aligned source process uses the gate stack to align the location of an etch, and in some cases, an implant. In one embodiment of the present invention, a chemical etch is used to etch the sidewall spacer on the source side of a core memory cell, wherein the chemical etch does not etch the gate stack, thus masking an area to etch. Although the chemical etch does not remove material from the gate stack, the etch does remove some material from the substrate 355 and as a result, a divot 397 is formed on the substrate 355.

Figure 3D:
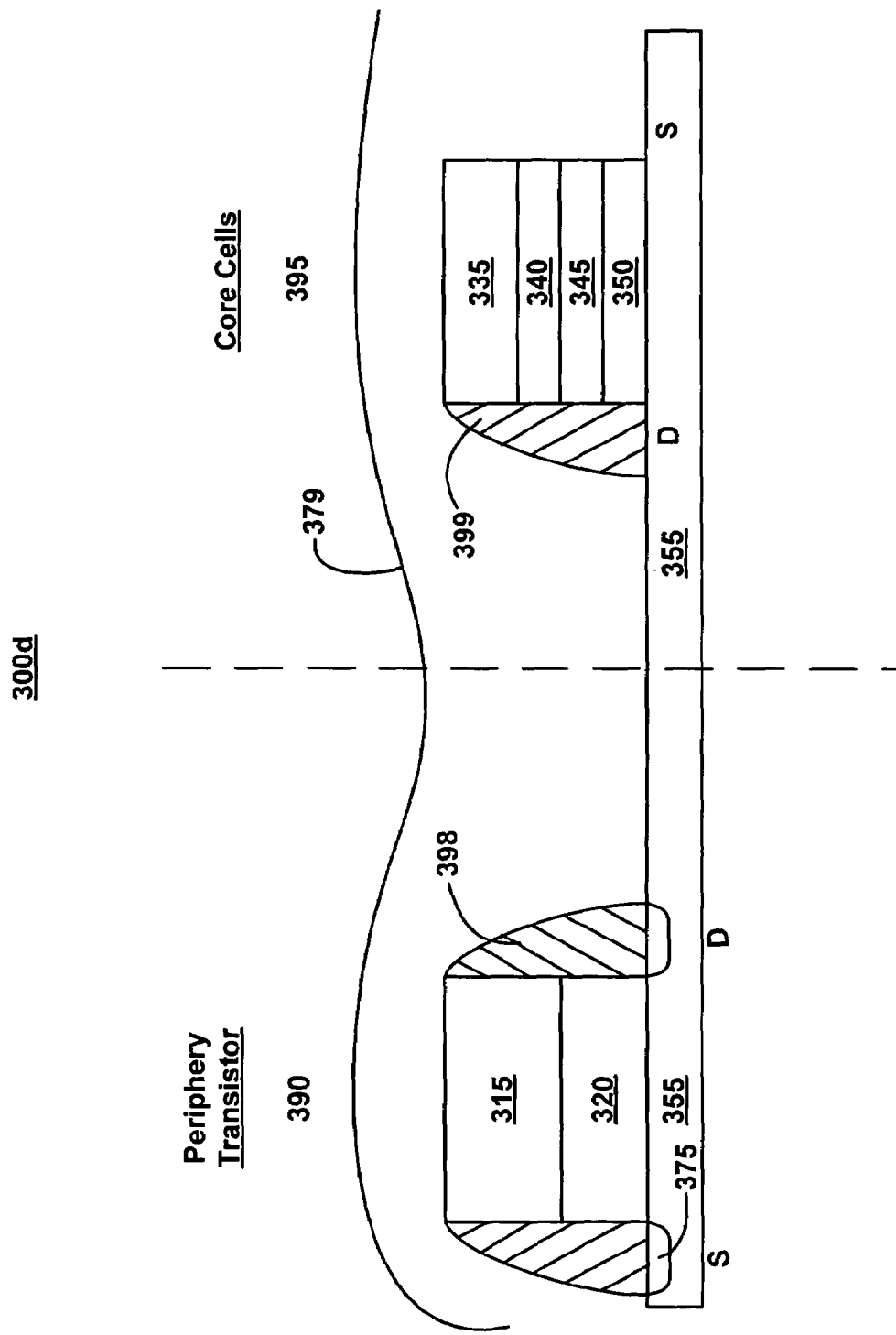
FIG. 3D illustrates a semiconductor device in accordance with one embodiment of the present invention, showing the formation of a nitride and oxide layer over the previously formed sidewall spacers.

FIG. 3D illustrates a state 300d in the fabrication of semiconductor device 300 in accordance with an embodiment of the present invention. Specifically, FIG. 3D shows the deposition of coating layer 379 over periphery transistor 390 and core memory cell 395. The deposition of an oxide liner and nitride is performed in step 408 of process 400 described in FIG. 4. In one embodiment of the present invention, the coating layer 379 can be an oxide liner and silicon nitride (SiN). The present embodiment forms an oxide layer over periphery transistor 390 core cell 395, and fills divot 397 from FIG. 3C.

Figure 3E:
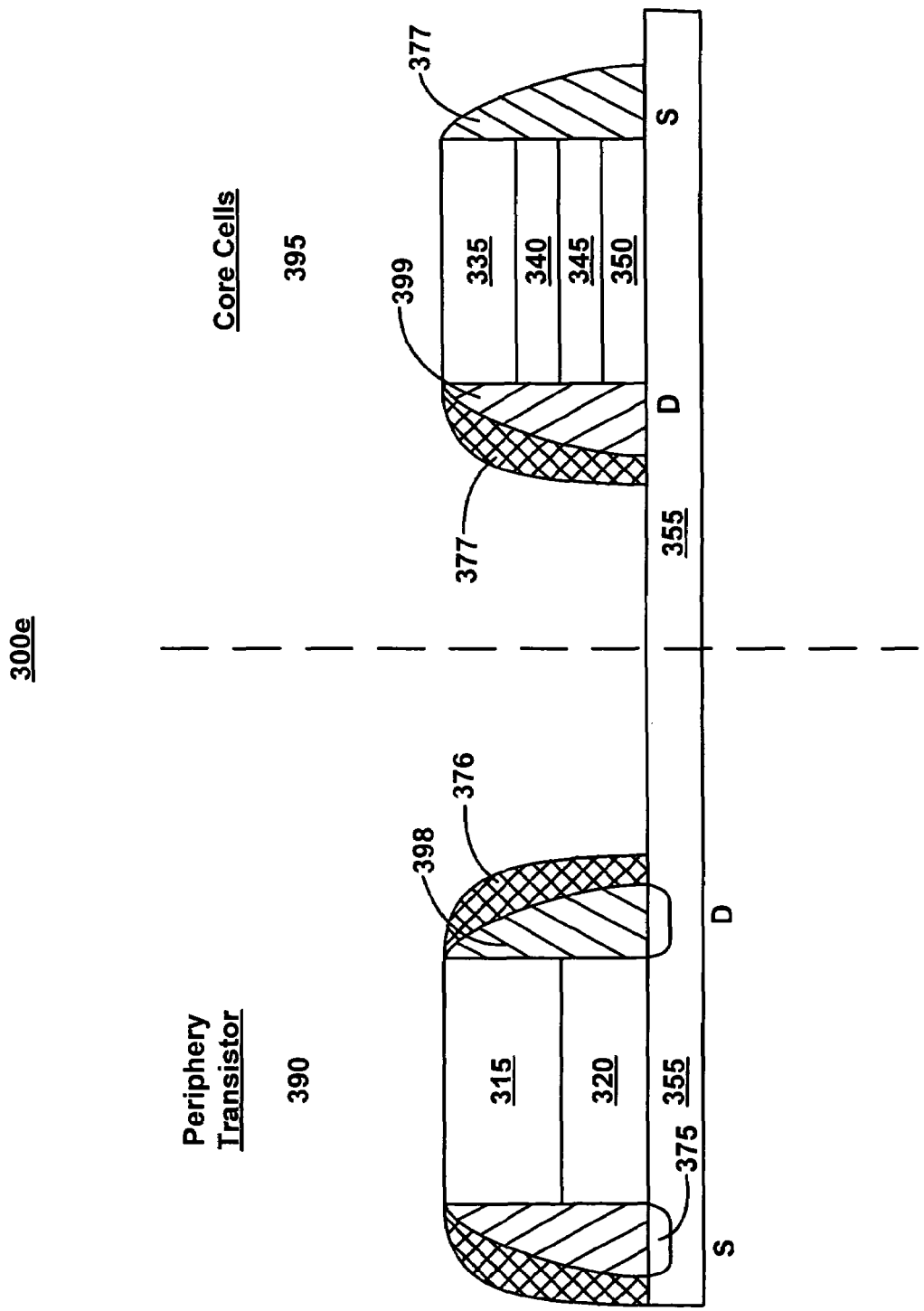
FIG. 3E illustrates a semiconductor device in accordance with one embodiment of the present invention, showing a narrow sidewall spacer formed on a core memory cell and a wide sidewall spacer formed on a periphery transistor.

FIG. 3E illustrates a further state 300e in the fabrication of semiconductor device 300e, in accordance with one embodiment of the present invention, showing the formation of sidewall spacers 376 in a periphery transistor 390 and side wall spacers 377 in a core memory cell 395 after a blanket etch to remove portions of the nitride layer 379 shown in FIG. 3D. The nitride etch is performed in step 410 of process 400 described in FIG. 4. According to one embodiment, the oxide layer (379 from FIG. 3D) fills between the periphery transistor and core memory cells 395 and after a blanket etch forms a portion of the sidewall spacer for the periphery transistor 390 and core memory cell 396. The excess oxide material is removed in a similar method as described in FIG. 3B. As a result of the second coating layer, the sidewall spacers for periphery transistor are two layers on both the source and drain side comprising layers 398 and 376 resulting in a wide spacer formation. The sidewall spacers for the core cells are two layers on the source side comprising layers 399 and 377. Since spacer 399 from FIG. 3C was removed on the drain side, the sidewall spacer on the drain side is a single layer comprising layer 377. The sidewall spacer on the drain side of the core cell 395 is a single layer and the sidewall spacer on the source side is two layers, resulting in a narrow spacer formation for the core memory cell 395.

For clarity, process 600 of FIG. 6 will be described in conjunction with FIGS. 5A–5F that illustrate structure 500 as it undergoes process 600 of FIG. 6.

Figure 5A:
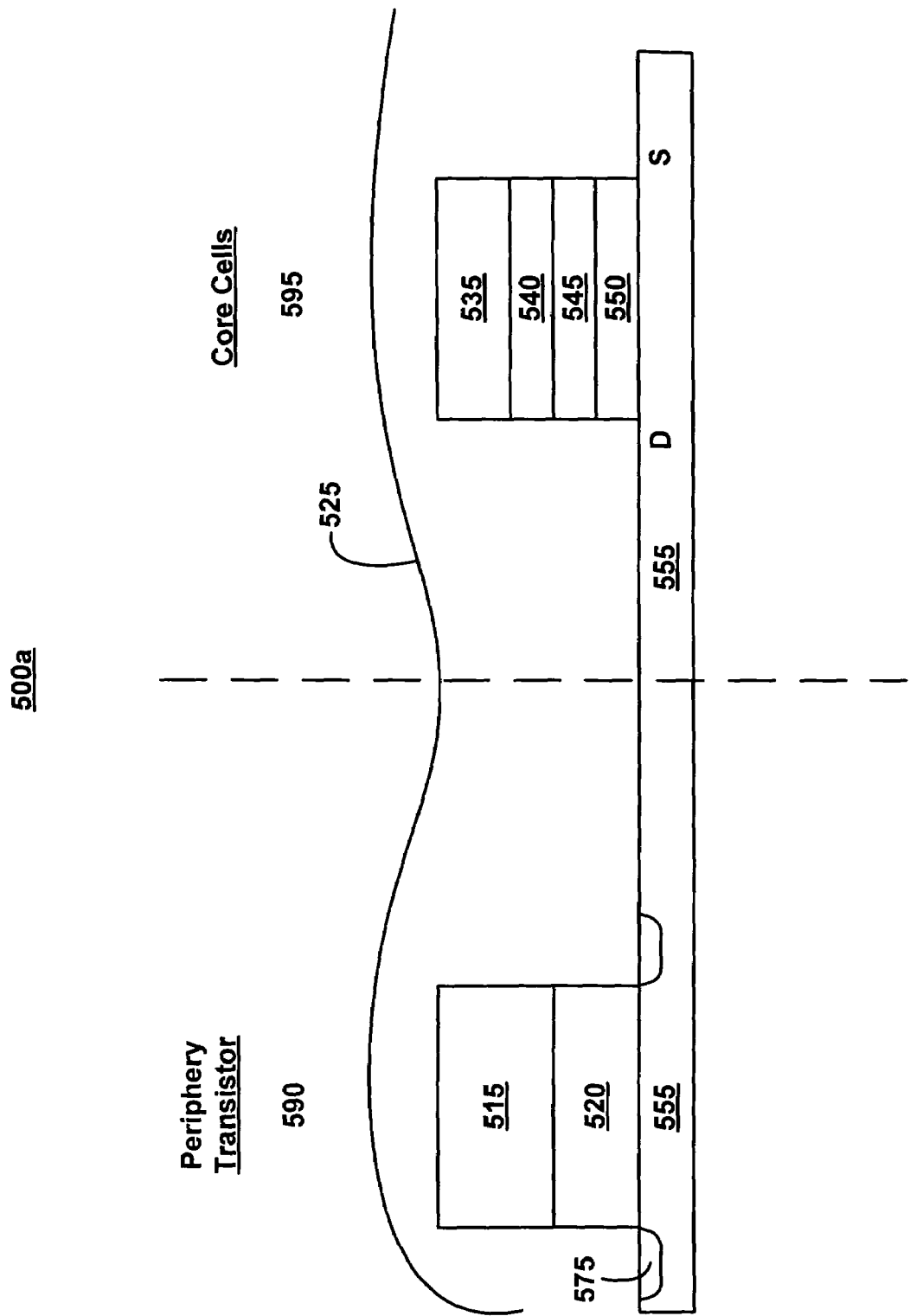
FIG. 5A illustrates a step, in an alternate method as illustrated in FIG. 4A, in the fabrication of a semiconductor device in accordance with one embodiment of the present invention, showing the formation of an oxide layer over a periphery transistor gate stack and over a core cell transistor gate stack
Figure 6:
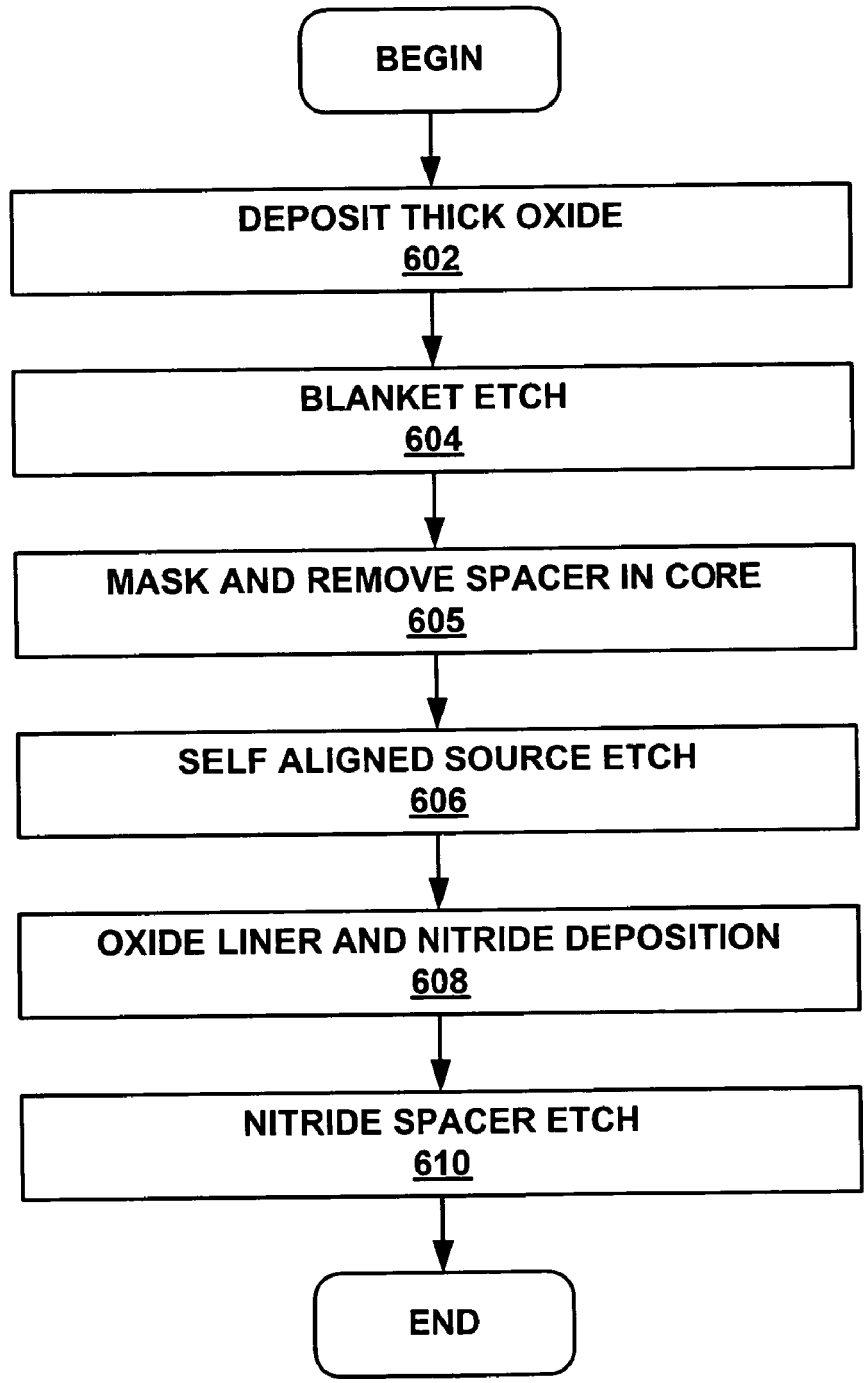
FIG. 6 is a flow diagram, in accordance with one embodiment of the present invention, of a method for fabricating semiconductor device.

FIG. 5A illustrates a state 500a in the fabrication of semiconductor device 500a in accordance with an embodiment of the present invention. Specifically, FIG. 5A shows the deposition of thick coating layer 525 over periphery transistor 590 and core memory cell 595. The deposition of thick oxide is step 602 of process 600 described in FIG. 6. The thick coating layer 525 can be silicon oxide alone or can be combined with silicon nitride (SiN). The present embodiment forms an oxide layer over periphery transistor 590 after lightly forming doped drain (LDD) region 575. In the present embodiment, periphery transistor 590 comprises a tunnel oxide layer 520 formed on a semiconductor substrate 555, and a polysilicon gate 515.

At the same time, core memory cells 595 receive the same coating layer 525 of silicon oxide. In one embodiment of the present invention, coating layer 525 is a combination of silicon oxide and silicon nitride. According to one embodiment, core memory cells 595 are flash memory cells. Flash memory cells are composed of a tunnel oxide layer 550 formed on substrate 555, a floating gate 545 formed on the tunnel oxide layer 550. A multi-level (e.g., ONO) insulating layer 540 is formed on the floating gate 545 and a control gate 535 formed on insulating layer 540.

Figure 5B:
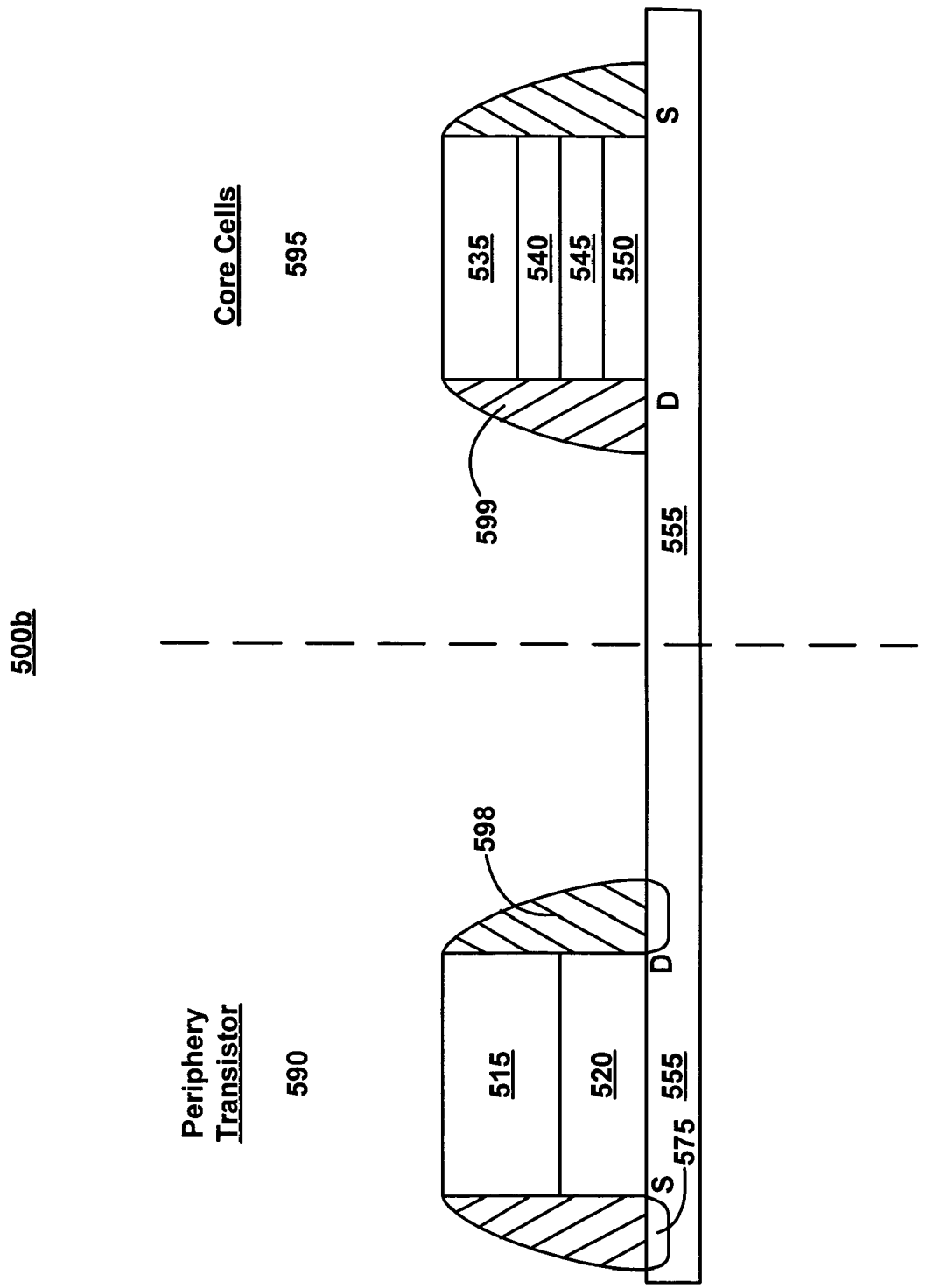
FIG. 5B illustrates a step, in an alternate method as illustrated in FIG. 4B, in the fabrication of a semiconductor device in accordance with one embodiment of the present invention, showing the formation of side wall spacers after a blanket etch.

FIG. 5B illustrates a further state 500b in the fabrication of semiconductor device 500b, in accordance with one embodiment of the present invention, showing the formation of side wall spacers 598 in a periphery transistor 590 and side wall spacers 599 in a core memory cell 595 after a blanket etch. A blanket etch is performed in step 604 of process 600 described in FIG. 6. According to one embodiment, the thick oxide layer (525 from FIG. 5A) fills between the periphery transistor and core memory cells 595 and after a blanket etch forms sidewall spacer 598 and 599. The excess silicon nitride layer between is removed during a blanket etch. In one embodiment of the invention, the blanket etch can be a chemical etch. The blanket etch enables the formation of sidewall region 598 at the periphery transistor and sidewall region 599 at the core memory cells. In one embodiment of the present invention, the sidewall spacers 598 and 599 are larger at the bottom end closest to substrate 555 and taper towards the top of the gate stack. In one embodiment of the present invention, the sidewall spacer 598 is substantially the same width at the bottom (closest to substrate 555) as the LDD 575.

FIG. 5C illustrates a further state 500c in the fabrication of semiconductor device 500c, in accordance with one embodiment of the present invention, showing the removal of sidewall spacers from core cell 595 using a mask and etch process. A mask structure is used to designate the areas where etching will remove oxide from the sidewalls of core cell 595. In one embodiment of the present invention, a chemical etch is used to remove oxide from the sidewalls of core cell 595. Masking and etching is performed in step 605 of process 600 described in FIG. 6.

Figure 5D:
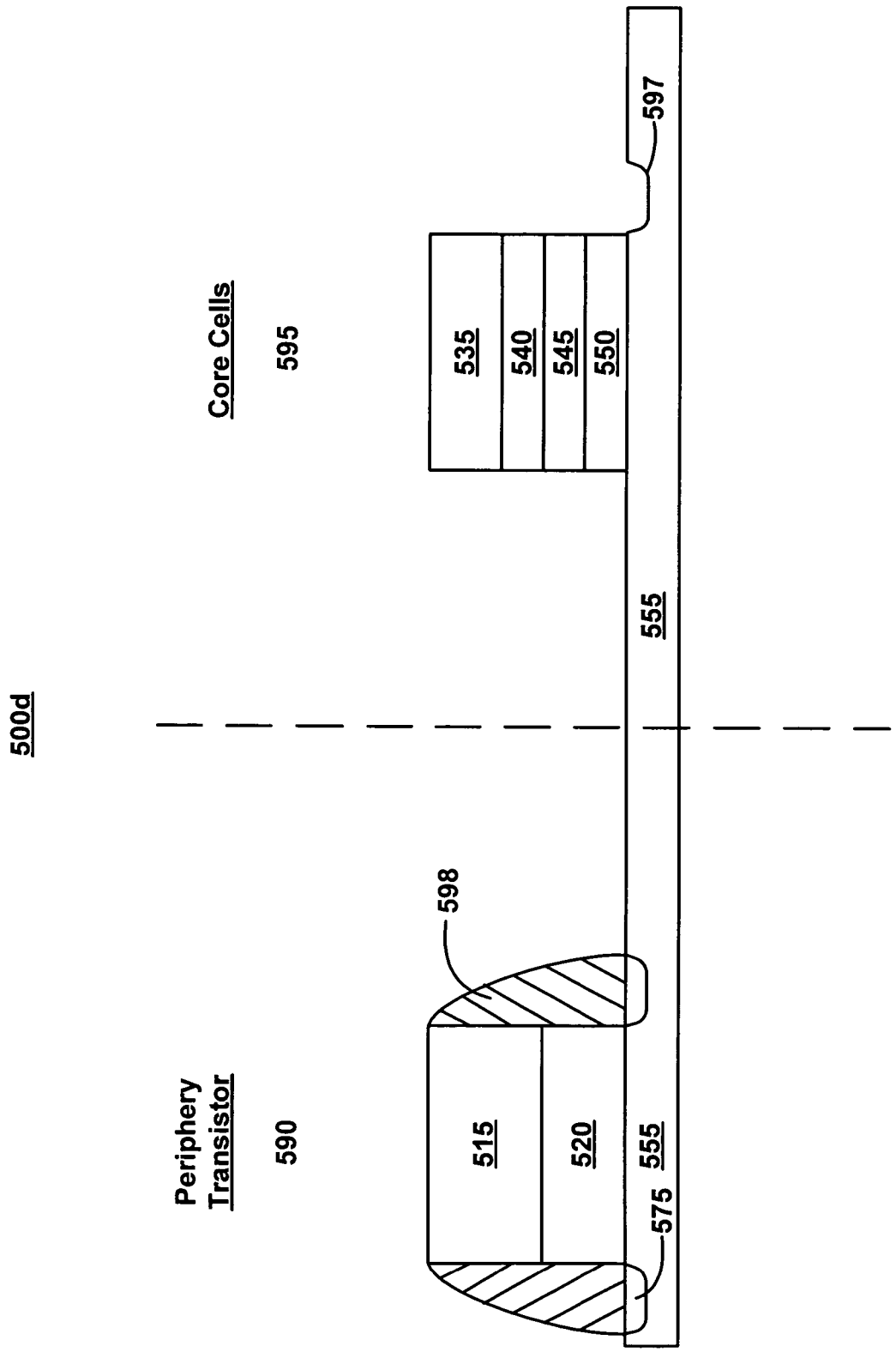
FIG. 5D illustrates a step, in an alternate method as illustrated in FIG. 4C, in the fabrication of a semiconductor device in accordance with one embodiment of the present invention, showing the formation of side wall spacers after a self-aligned source etch.

FIG. 5D illustrates a semiconductor device in accordance with one embodiment of the present invention, showing the effects on substrate 555 after a self-aligned source (SAS) etch on the source side of core cell 595. A SAS etch is performed in step 606 of process 600 described in FIG. 6. A self-aligned source process uses the gate stack to align the location of an etch, and in some cases, an implant. In one embodiment of the present invention, a chemical etch is used to etch the sidewall spacer on the source side of a core memory cell, wherein the chemical etch does not etch the gate stack, thus masking an area to etch. Although the chemical etch does not remove material from the gate stack, the etch does remove some material from the substrate 555 and as a result, a divot 597 is formed on the substrate 555. The SAS etch is an intermediary processing step in the fabrication of a core memory cell and is not essential to process 600 described in FIG. 6.

Figure 5E:
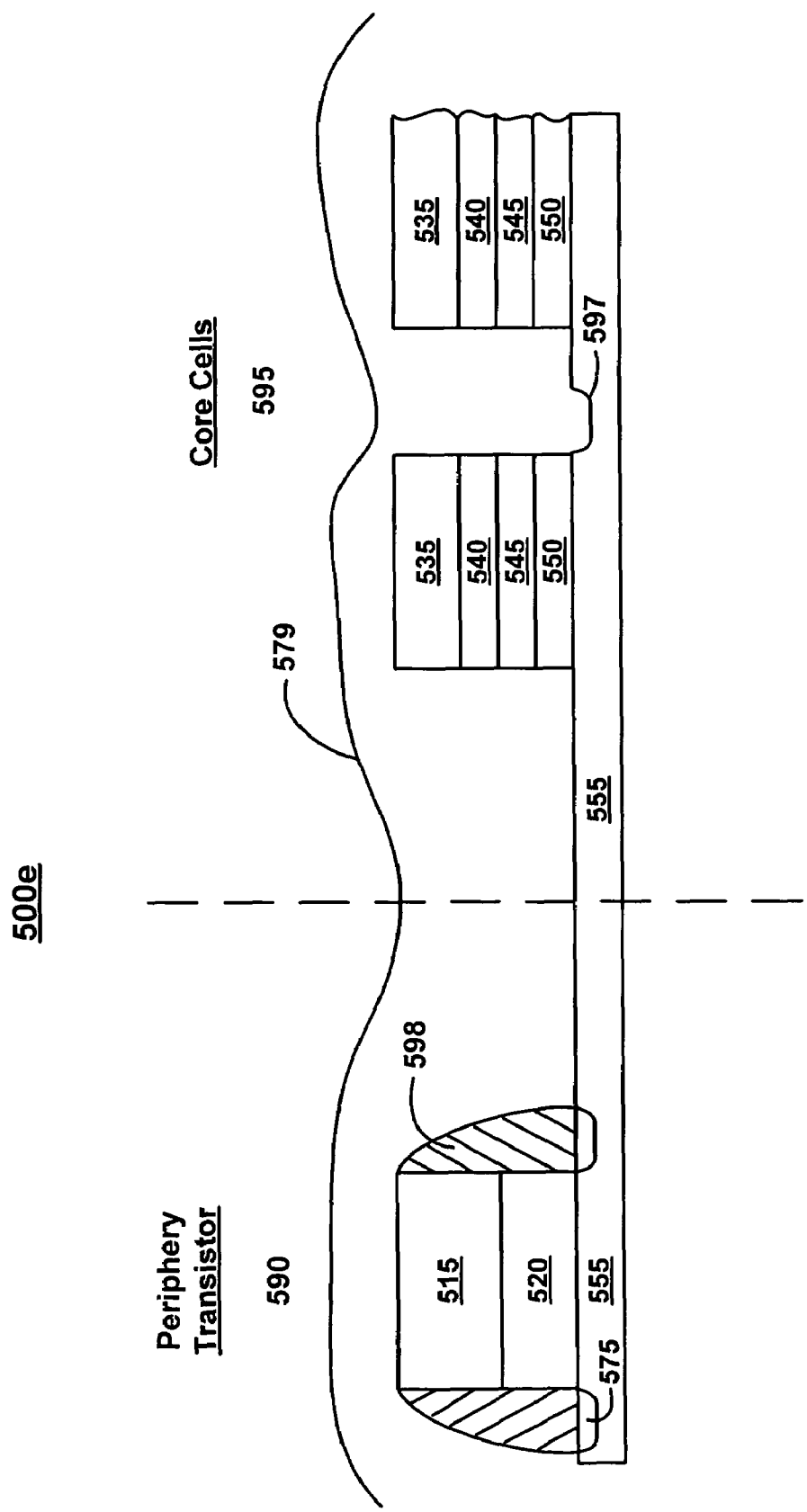
FIG. 5E illustrates a step, in an alternate method as illustrated in FIG. 3D, in the fabrication of a semiconductor device in accordance with one embodiment of the present invention, showing the formation of a nitride and oxide layer over the previously formed sidewall spacers.

FIG. 5E illustrates a state 500e in the fabrication of semiconductor device 500 in accordance with an embodiment of the present invention. Specifically, FIG. 5E shows the deposition of coating layer 579 over periphery transistor 590 and core memory cell 595. The deposition of an oxide liner and nitride is performed in step 608 of process 600 described in FIG. 6. In one embodiment of the present invention, the coating layer 579 can be an oxide liner and silicon nitride (SiN). The present embodiment forms an oxide layer over periphery transistor 590 and core cell 595, and fills divot 597 resulting from an SAS etch performed in step 606 of process 600 of FIG. 6.

Figure 5F:
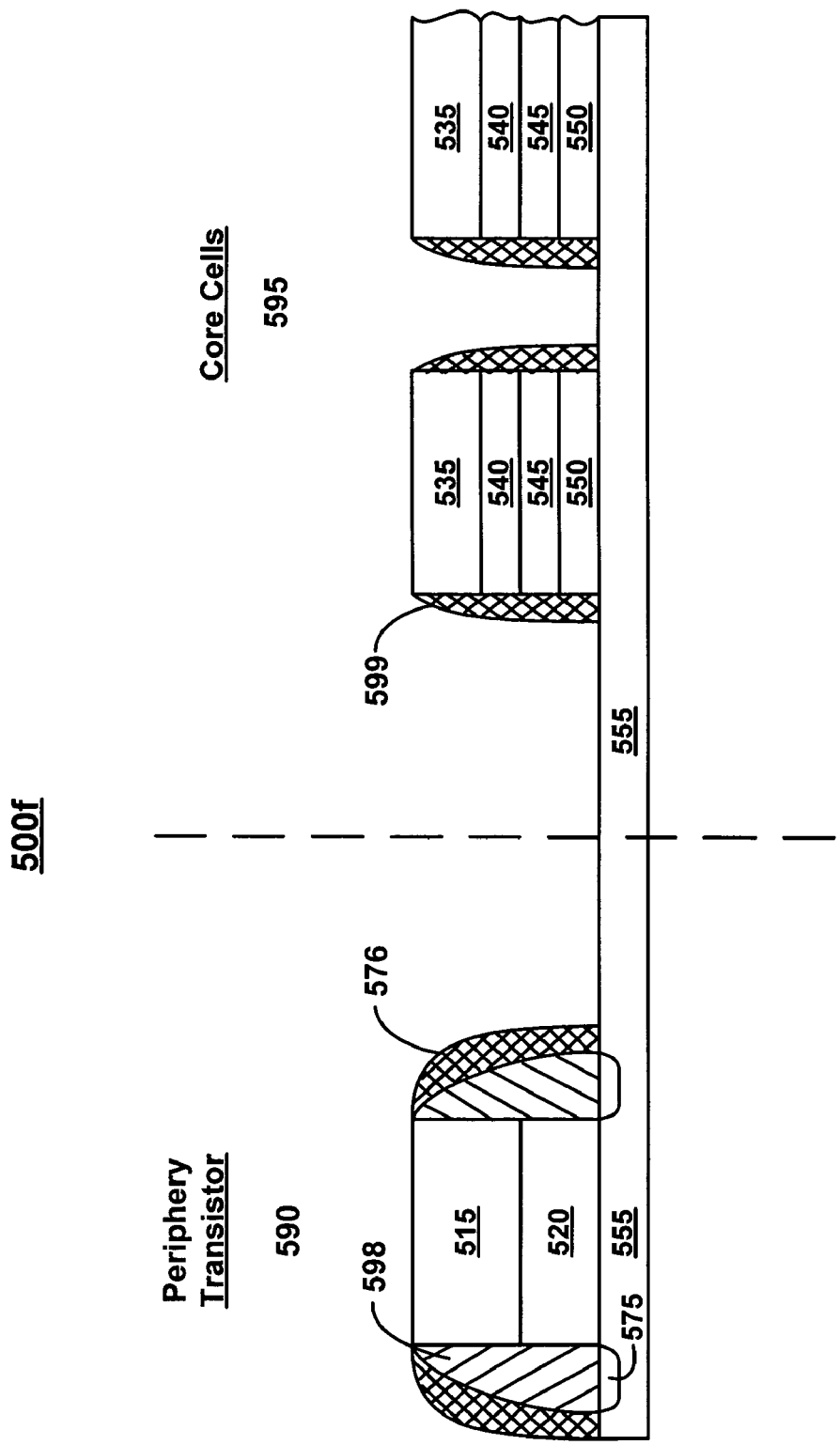
FIG. 5F illustrates a step, in an alternate method as illustrated in FIG. 3E, in the fabrication of a semiconductor device in accordance with one embodiment of the present invention, showing a narrow sidewall spacer formed on a core memory cell and a wide sidewall spacer formed on a periphery transistor.

FIG. 5F illustrates a further state 500f in the fabrication of semiconductor device 500, in accordance with one embodiment of the present invention, showing the formation of sidewall spacers 576 in a periphery transistor 590 and side wall spacers 577 in a core memory cell 595 after a blanket etch to remove portions of the nitride layer 579 shown in FIG. 5E. The nitride etch is performed in step 610 of process 600 described in FIG. 6. According to one embodiment, the oxide layer (579 from FIG. 5E) fills between the periphery transistor and core memory cells 595 and after a blanket etch forms a portion of the sidewall spacer for periphery transistor 590 and core memory cell 596. The excess oxide material is removed in a similar method as described in FIG. 5B. As a result of the second coating layer, the sidewall spacers for periphery transistor are two layers on both the source and drain side comprising layers 598 and 576 resulting in a wide spacer formation. The sidewall spacers for the core cells comprise layer 599 on both the drain and source side. The sidewall spacer on the drain side of the core cell 395 is a single layer and the sidewall spacer on the source side is also a single layer, resulting in a narrow spacer formation for the core memory cell 395. The side walls for periphery transistor 590 comprise two layers 598 and 576 thus resulting in a wide spacer formation on the periphery transistor 590.

While the methods of embodiments illustrated in flow charts 400 and 600 show specific sequences and quantities of steps, the present invention is suitable to alternative embodiments. For example, not all of the steps provided for in the method or methods are required for the present invention. Furthermore, additional steps may be added to the steps presented in the discussed embodiments. Likewise, the sequence of steps may be modified, depending upon the application.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of manufacturing a semiconductor device comprising:

a) depositing a first layer over a periphery transistor comprising a gate stack, a drain side sidewall and a source side sidewall and over a core transistor comprising a gate stack, a source side sidewall and a drain side sidewall;

b) etching said first layer wherein a portion of said first layer remains on said source side sidewall and on said drain side sidewall of said periphery transistor and on said source side sidewall and on said drain side sidewall of said core transistor;

c) etching said first layer from said source side sidewall of said core transistor while preserving said first layer on said drain side sidewall of said core transistor;

d) depositing a second layer over said periphery transistor and said core transistor; and e) etching said second layer wherein a portion of said second layer remains on said first layer formed on said source side sidewall and on said drain side sidewall of said periphery transistor and wherein said second layer remains on said source side sidewall and on said drain side sidewall of said core transistor.

2. The method as described in claim 1 wherein said first layer is silicon nitride.

3. The method as described in claim 1 wherein said first layer is silicon oxide and silicon nitride.

4. The method as described in claim 1 wherein said second layer is silicon nitride.

5. The method as described in claim 1 wherein said b) is a chemical etch, wherein said chemical etch does not remove material from said gate stack of said periphery transistor and does not remove material from said gate stack of said core transistor.

6. The method as described in claim 1 wherein said c) is a self aligned source etch.

7. The method as described in claim 1 wherein said first layer is thicker than said second layer.

8. The method as described in claim 1 wherein said core transistor is a flash memory cell.

9. A method for simultaneously manufacturing a wide sidewall spacer on a periphery transistor and a narrow sidewall spacer on a core transistor comprising:
   a) depositing a first layer over a periphery transistor comprising a gate stack, a drain side sidewall and a source side sidewall and over a core transistor comprising a gate stack, a source side sidewall and a drain side sidewall;
   b) etching said first layer wherein a portion of said first layer remains on said source side sidewall and on said drain side sidewall of said periphery transistor and on said source side sidewall and said drain side sidewall of said core transistor;
   c) masking and etching said first layer from said source side sidewall while preserving said first layer on said drain sidewall of said core transistor;
   d) depositing a second layer over said periphery transistor and said core transistor; and
   e) etching said second layer wherein a portion of said second layer remains on said first layer formed on said source side sidewall and said drain side sidewall of said periphery transistor resulting in a wide sidewall spacer and wherein said second layer remains on said source side sidewall and said drain side sidewall of said core transistor resulting in a narrow sidewall spacer.

10. The method as described in claim 9 wherein said first layer is silicon nitride.

11. The method as described in claim 9 wherein said first layer is silicon oxide and silicon nitride.

12. The method as described in claim 9 wherein said second layer is silicon nitride.

13. The method as described in claim 9 wherein said b) is a chemical etch, wherein said chemical etch does not remove material from said gate stack of said periphery transistor and does not remove material from said gate stack of said core transistor.

14. The method as described in claim 9 wherein said first layer is thicker than said second layer.

15. The method as described in claim 9 wherein said core transistor is a flash memory cell.

16. A method for simultaneously manufacturing a semiconductor comprising a wide sidewall spacer and a narrow sidewall spacer comprising:
   a) depositing a first layer over a first transistor comprising a gate stack, a drain side sidewall and a source side sidewall and over a second transistor comprising a gate stack, a source side sidewall and a drain side sidewall;
   b) etching said first layer wherein a portion of said first layer remains on said source side sidewall and on said drain side sidewall of said first transistor and on said source side sidewall and on said drain side sidewall of said second transistor;
   c) etching said first layer from said source side sidewall of said second transistor while preserving said first layer on said drain sidewall of said second transistor;
   d) depositing a second layer over said first transistor and said second transistor; and
   e) etching said second layer wherein a portion of said second layer remains on said first layer formed on said source side sidewall and on said drain side sidewall of said first transistor and wherein said second layer remains on said source side sidewall and on said drain side sidewall of said second transistor.

17. The method as described in claim 16 wherein said first transistor is a periphery transistor.

18. The method as described in claim 16 wherein said second transistor is a core transistor.

19. The method as described in claim 18 wherein said core transistor is a flash memory cell.

20. The method as described in claim 16 wherein said first layer comprises silicon oxide and silicon nitride.

21. The method as described in claim 16 wherein said second layer comprises nitride.

22. The method as described in claim 16 wherein said c) is a self aligned source etch.

23. The method as described in claim 16 wherein said first layer is thicker than said second layer.

* * * * *